United States Patent
Shiomi

(10) Patent No.: US 11,323,021 B2
(45) Date of Patent: May 3, 2022

(54) SNUBBER CIRCUIT AND POWER SUPPLY APPARATUS

(71) Applicant: SHARP KABUSHIKI KAISHA, Sakai (JP)

(72) Inventor: Takeshi Shiomi, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 17/190,998

(22) Filed: Mar. 3, 2021

(65) Prior Publication Data

US 2021/0288573 A1 Sep. 16, 2021

(30) Foreign Application Priority Data

Mar. 13, 2020 (JP) ............................. JP2020-044290

(51) Int. Cl.
*H02M 1/34* (2007.01)
*H03K 17/56* (2006.01)
*H02M 7/538* (2007.01)

(52) U.S. Cl.
CPC ............. *H02M 1/34* (2013.01); *H02M 7/538* (2013.01); *H03K 17/56* (2013.01); *H02M 1/346* (2021.05)

(58) Field of Classification Search
CPC .......... H02M 1/34; H02M 1/32; H02M 1/342; H02M 1/344; H02M 1/348; H02M 1/346; H02M 7/538; H03K 17/56
See application file for complete search history.

(56) References Cited

U.S. PATENT DOCUMENTS

| | | | | |
|---|---|---|---|---|
| 8,000,112 B2* | 8/2011 | Zhang | ................ | H02M 1/34 |
| | | | | 363/21.01 |
| 9,531,252 B2* | 12/2016 | Yatsu | ................ | H02M 7/538 |
| 10,224,808 B2* | 3/2019 | Torii | ................ | H02M 1/14 |
| 10,505,440 B1* | 12/2019 | Lu | ................ | H02M 3/1582 |
| 2013/0188404 A1 | 7/2013 | Nakamura | | |
| 2021/0320584 A1* | 10/2021 | Shiomi | ................ | H02M 1/346 |

FOREIGN PATENT DOCUMENTS

JP 2012-039810 A 2/2012

* cited by examiner

*Primary Examiner* — Adolf D Berhane
(74) *Attorney, Agent, or Firm* — ScienBiziP, P.C.

(57) ABSTRACT

A snubber circuit configured to be coupled to a switching circuit, comprises a snubber capacitor; a diode; and a coil, wherein the switching circuit includes an upper switch element coupled between a high potential node and a switch node, a lower switch element coupled between the switch node and a reference potential node, and a bypass capacitor coupled between the high potential node and the reference potential node, a positive electrode of the snubber capacitor is configured to be coupled to the high potential node, an anode of the diode is coupled to a negative electrode of the snubber capacitor, and a cathode of the diode is coupled to the switch node, and one end of the coil is coupled to the negative electrode of the snubber capacitor, and another end of the coil is coupled to the reference potential node.

6 Claims, 3 Drawing Sheets

SNUBBER CIRCUIT AND POWER SUPPLY APPARATUS

BACKGROUND

1. Field

The following disclosure relates to a snubber circuit.

2. Description of the Related Art

A snubber circuit is a component additionally provided for suppressing surge voltage applied to a switch element. However, one problem is that losses occur in the snubber circuit. Japanese Unexamined Patent Application Publication No. 2012-39810 discloses a discharge preventing snubber for reducing losses in the snubber circuit.

When such a discharge preventing snubber is used, losses still remain to be reduced. An aspect of the present disclosure provides a snubber circuit capable of reducing losses more than known technologies.

SUMMARY

A snubber circuit according to an aspect of the present disclosure is configured to be coupled to a switching circuit having a high potential node, a switch node, and a reference potential node. The snubber circuit includes a snubber capacitor, a diode, and a coil. The switching circuit includes an upper switch element coupled between the high potential node and the switch node, a lower switch element coupled between the switch node and the reference potential node, and a bypass capacitor coupled between the high potential node and the reference potential node. The positive electrode of the snubber capacitor is configured to be coupled to the high potential node. The diode is configured such that (i) the anode of the diode is coupled to the negative electrode of the snubber capacitor and (ii) the cathode of the diode is coupled to the switch node. The coil is configured such that (i) one end of the coil is coupled to the negative electrode of the snubber capacitor and (ii) the other end of the coil is coupled to the reference potential node.

Furthermore, a snubber circuit according to an aspect of the present disclosure is configured to be coupled to a high potential node, a switch node, and a reference potential node. The snubber circuit includes a snubber capacitor, a diode, and a coil. The positive electrode of the snubber capacitor is configured to be coupled to the high potential node. The diode is configured such that (i) the anode of the diode is coupled to the negative electrode of the snubber capacitor and (ii) the cathode of the diode is coupled to the switch node. The coil is configured such that (i) one end of the coil is coupled to the negative electrode of the snubber capacitor and (ii) the other end of the coil is coupled to the reference potential node.

DESCRIPTION OF THE EMBODIMENTS

First Embodiment

Figure 1:
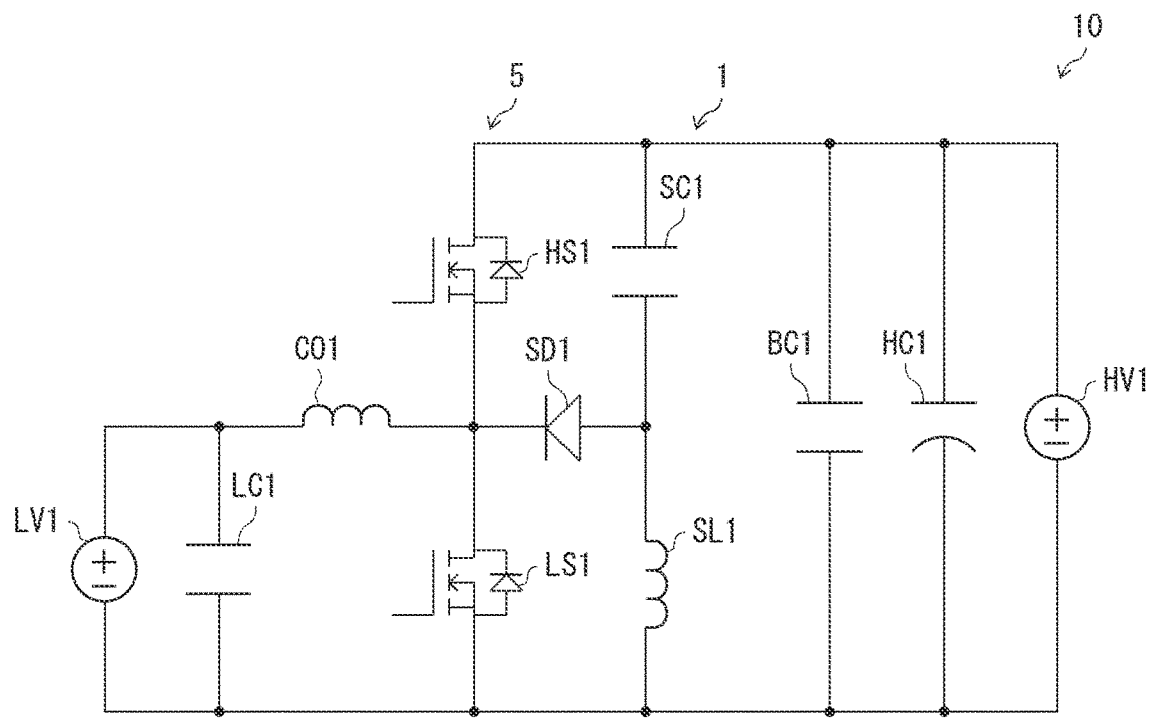
FIG. 1 illustrates a snubber circuit and a power supply circuit according to a first embodiment.

A first embodiment can suppress surge voltage occurring in a power supply circuit 10 by using a snubber circuit 1 configured to achieve low loss. This will be described with reference to FIGS. 1 to 4. When components of another embodiment after the first embodiment have the same functions as functions of components of the first embodiment, the components are assigned the same reference characters, and descriptions thereof are not repeated. To simplify descriptions, for example, a "high-voltage power supply HV1" is also simply referred to as "HV1". It is noted that numerical values mentioned below are mere examples.

Overview of Configuration of Power Supply Circuit 10

The power supply circuit 10 is a bidirectional DC-DC converter configured to bidirectionally transmit electric power between a low-voltage power supply LV1 and a high-voltage power supply HV1. The power supply circuit 10 includes the snubber circuit 1. The snubber circuit 1 is coupled to a switching circuit 5 of the power supply circuit 10.

Configuration of Low-Voltage Section of Power Supply Circuit 10

A low-voltage section of the power supply circuit 10 includes LV1, a capacitor LC1, and a coil CO1. The voltage at the positive electrode (+ side) of LV1 is 200 V while the voltage at the negative electrode (− side) is 0 V. The electrostatic capacity of LC1 is 1 µF. The inductance of CO1 is 1 mH and the average current in CO1 is 12 A.

Configuration of High-Voltage Section of Power Supply Circuit 10

A high-voltage section of the power supply circuit 10 includes HV1, a capacitor HC1, and a bypass capacitor BC1. The voltage at the positive electrode (+ side) of HV1 is 400 V while the voltage at the negative electrode (− side) is 0 V. The electrostatic capacity of HC1 is 1 mF. BC1 is a film capacitor with an electrostatic capacity of 1 µF. In the first embodiment, the reference potential is 0 V. The node of 0 V is referred to as a reference potential node. Potentials higher than the reference potential are referred to as high potentials. The node of a high potential is referred to as a high potential node. The high potentials in this specification range, for example, from 10 to 1200 V. The node of 400 V is an example of a high potential node.

BC1 is positioned closer to a switch described later than HC1. BC1 is coupled between the high potential node and the reference potential node.

Configuration of Switch of Power Supply Circuit 10

The switch has a half-bridge configuration composed of an upper switch element HS1 and a lower switch element LS1. The switching circuit 5 is constituted by BC1 in addition to HS1 and LS1. The gate terminal of HS1 and the gate terminal of LS1 are both coupled to a control circuit 9 described later. The connection point of HS1 and LS1 is a switch node. One end of CO1 is coupled to the switch node. The voltage at the switch node is alternately changed between 400 V and 0 V by switching of HS1 or LS1.

HS1 and LS1 are cascode GaN high electron mobility transistors (HEMTs) with a drain withstand voltage of 650 V and an on-resistance of 50 mΩ. In the example in FIG. 1, the cascode GaN HEMT is represented by a circuit symbol of a metal-oxide-semiconductor field-effect transistor (MOSFET). HS1 is coupled between the high potential node and the switch node. LS1 is coupled between the switch node and the reference potential node.

HS1 and LS1 can be replaced with other kinds of switch elements in accordance with the type of the power supply circuit. The switch element in this specification is defined as follows.

"Switch element": an element configured to change the voltage at a particular node, such as the switch node. Examples of the switch element include a rectifier element, a transistor element, and a magnetic element such as windings or coils of a transformer.

Configuration of Snubber Circuit 1 of Power Supply Circuit 10

The snubber circuit 1 includes a snubber capacitor SC1, a diode SD1, and a coil SL1.

SC1 is a multilayer ceramic capacitor with a withstand voltage of 630 V and an electrostatic capacity of 4.7 nF. The positive electrode (upper side in FIG. 1) of SC1 is coupled to the nigh potential node.

SD1 is a fast recovery diode (FRD) with a withstand voltage of 600 V. The forward voltage (VF) across the FRD when connection is established is 1 V. The resistance of the FRD in a connected state is 0.13Ω. The anode of SD1 is coupled to the negative electrode (lower side in FIG. 1) of SC1. The cathode of SD1 is coupled to the switch node.

SL1 is a chip coil with an inductance of 470 nH and a resistance of 70 mΩ. One end of SL1 is coupled to the negative electrode of SC1. The other end of SL1 is coupled to the reference potential node.

Description of Operation of Power Supply Circuit 10

The power supply circuit 10 operates in the same manner as usual bidirectional DC-DC converters. By controlling switch-on and -off of HS1 or LS1, electric power is bidirectionally transmitted. When HS1 is switched off, surge voltage occurs between the high potential node and the switch node; in other words, surge voltage occurs across HS1.

An operation of the snubber circuit 1 will be described with reference to FIGS. 2 to 4.

Figure 2:
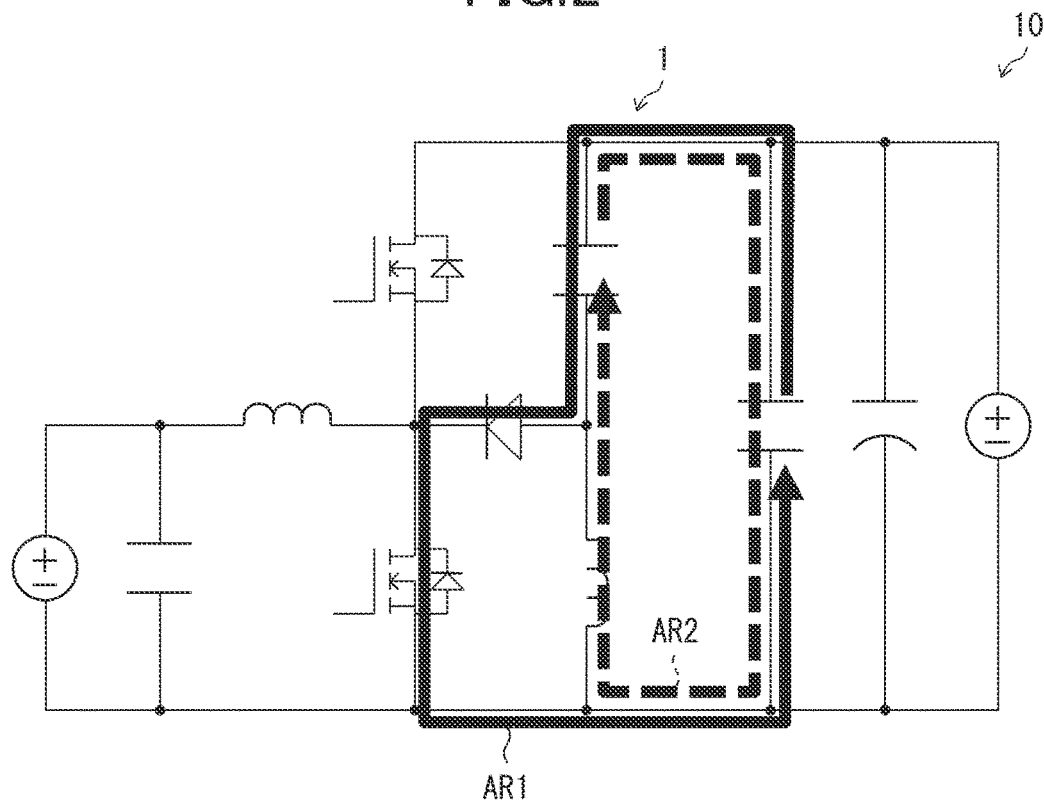
FIG. 2 illustrates current paths in the snubber circuit.

FIG. 2 illustrates current paths in the snubber circuit 1 in FIG. 1. FIG. 2 indicates the same circuit diagram as in FIG. 1, but some reference characters in FIG. 1 are omitted in FIG. 2.

Figure 3:
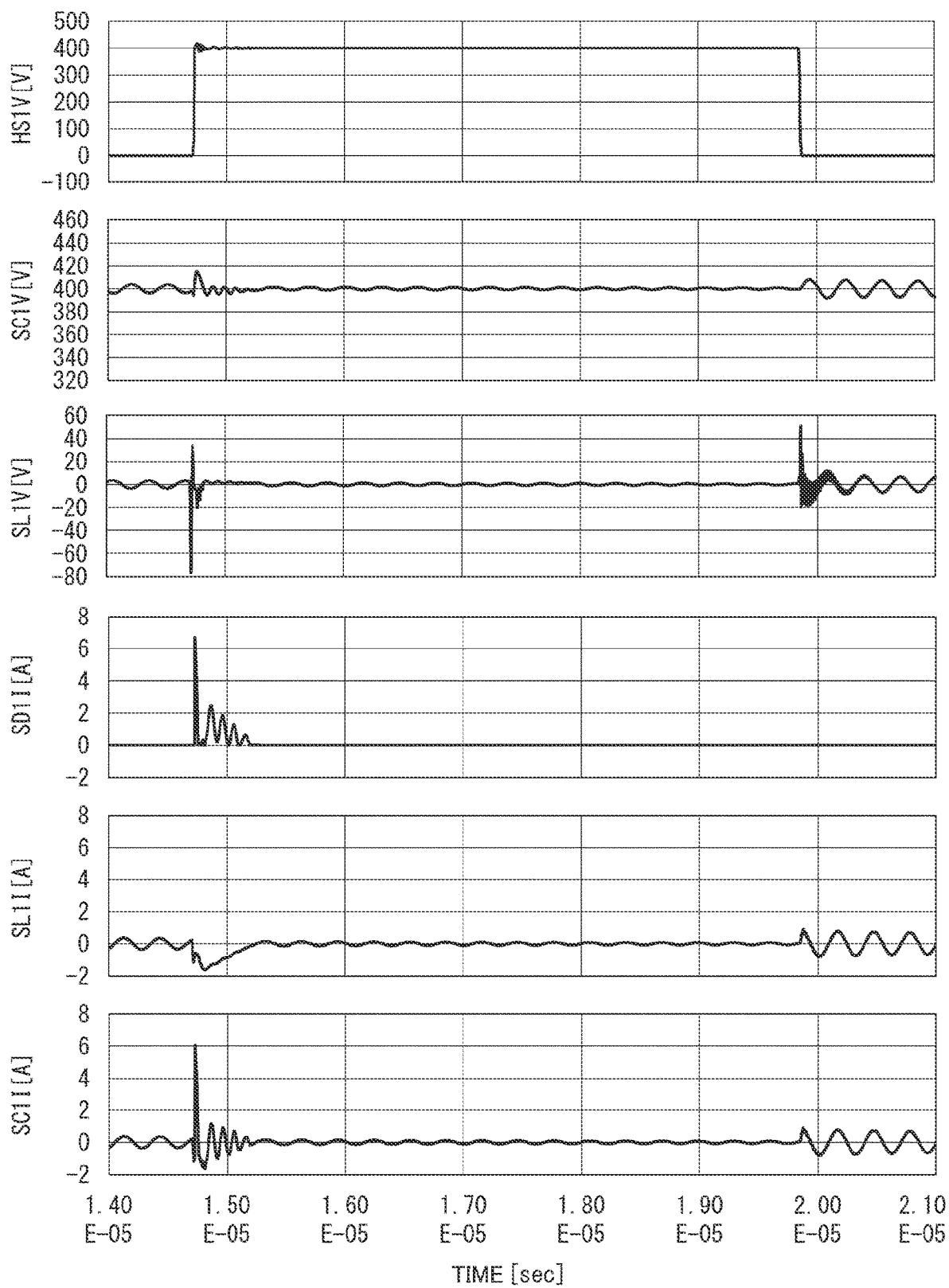
FIG. 3 illustrates operating waveforms at components of the snubber circuit.

FIG. 3 illustrates waveforms at the respective components of the snubber circuit 1 by using the same time axis (horizontal axis). The waveforms in FIG. 3 represent:

HS1V (voltage across HS1): potential at the high potential node with reference to the switch node;

SC1V (voltage across SC1): potential at the positive electrode with reference to the negative electrode;

SL1V (voltage across SL1): potential at the terminal on the SC1 side with reference to the terminal on the reference potential node;

SD1I (current in SD1): current flowing from the anode to the cathode;

SL1I (current in SL1): current flowing from the terminal on the SC1 side to the terminal on the reference potential node side; and SC1I (current in SC1): current flowing from the positive electrode to the negative electrode.

Figure 4:
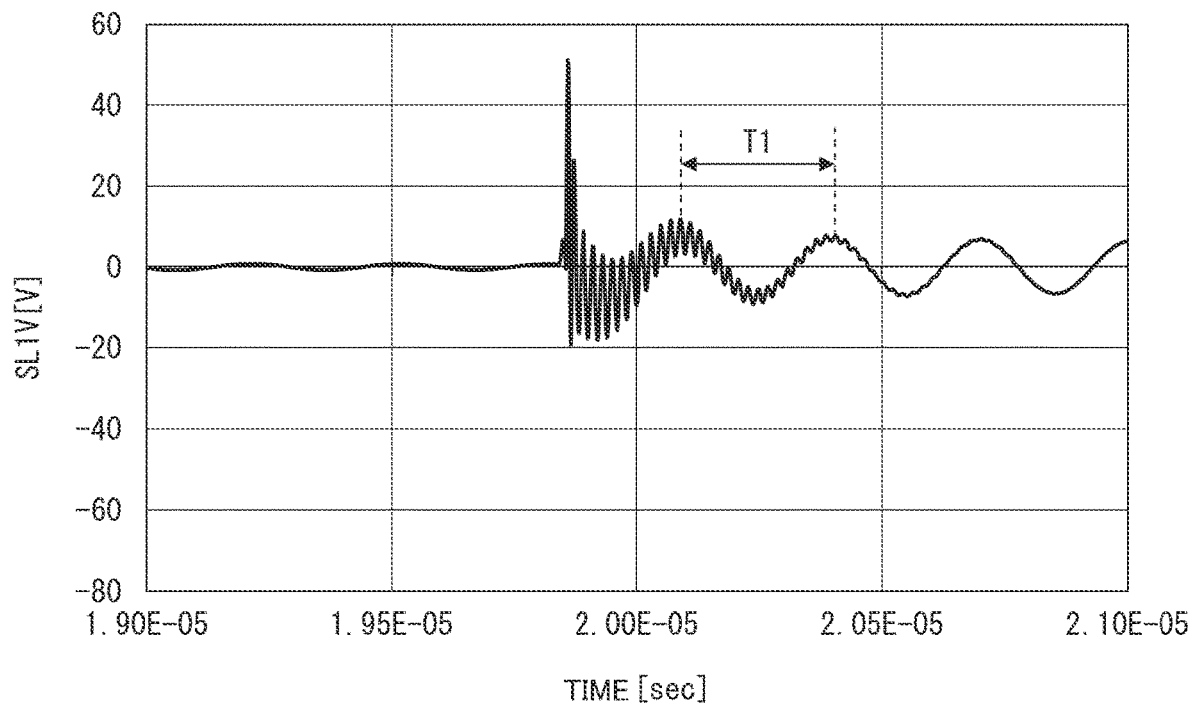
FIG. 4 illustrates a voltage waveform at a coil of the snubber circuit.

FIG. 4 is an enlarged diagram of SL1V in FIG. 3.

Operation Method of Snubber Circuit

In the operation of the snubber circuit 1, the following three steps are performed in the order presented:

First step: causing surge voltage between the high potential node and the switch node;

Second step: charging SC1 with the surge voltage via SD1;

Third step: discharging the voltage across the charged SC1 to the high potential node through SL1.

First Step: Causing Surge Voltage

In the first step, HS1 is switched from on to off. HS1 is switched at a time point of "1.47E-5 sec" in FIG. 3. This switching causes surge voltage at the high potential node with respect to the switch node. When the power supply circuit 10 is not coupled with the snubber circuit 1, a surge voltage of 480 V occurs (not illustrated in the drawing), while the steady voltage is 400 V. In the first embodiment, since the power supply circuit 10 is coupled with the snubber circuit 1, the surge voltage is reduced to 410 V (refer to HS1V in FIG. 3).

Second Step: Charging SC1 with Surge Voltage

The reduced amount of surge voltage (480 V−410 V=70 V) is absorbed by SC1 through SD1; in other words, SC1 is charged with the reduced amour surge voltage. The charging with the reduced amount of surge voltage is caused immediately after the first step (almost at the same time as the first step). SC1 is charged with surge voltage at a time point of "1.475E-5 sec" in FIG. 3. It can be seen from FIG. 3 that SD1I and SC1I flow and SC1V increases (SC1 is charged). The charge path of SC1 is indicated by an arrow AR1 in FIG. 2. The energy of the surge voltage (charge current in SC1) is supplied as current from BC1, and afterward, the energy returns to BC1 via SC1, SD1, and LS1.

Third Step: Discharging Voltage Across SC1 to High Potential Node

The voltage across the charged SC1 is changed from the voltage in the steady state (400 V) to 410 V (refer to SC1V in FIG. 3). The discharging of SC1 starts immediately after the second step. The discharging of SC1 starts at a time point of "1.48E-5 sec" in FIG. 3. The voltage across SC1 is discharged to the high potential node through SL1 slowly over the period from 1.48E-5 to 1.53E-5 sec. In the case of the power supply circuit 10, BC1 coupled to the high potential node is charged with the voltage across SC1. The discharge path of SC1 starts from SC1, passes through BC1 and SL1, and returns to SC1. The discharge path of SC1 is indicated by an arrow AR2 in FIG. 2. SL1 smoothens the discharge current from SC1, and BC1 is slowly charged with the discharge current. Consequently, it is possible to reduce losses in the snubber circuit 1.

First and Second Improvements for Operation of Snubber Circuit 1

Multiple desirable improvements are applied to the first embodiment. Hereinafter, these desirable improvements will be described.

First Improvement: Inductance of Discharge Path of SC1 is Higher Than Inductance of Charge Path of SC1

In the example of the first embodiment, the path AR1, that is, the path constituted by SC1, SD1, LS1, and BC1 is designed to have an inductance (hereinafter referred to as L1) as low as 50 nH. SC1 thus speedily absorbs the surge voltage, and as a result, it is possible to effectively suppress surge voltage. By contrast, the path AR2, that is, the path constituted by SC1, SL1, and BC1 is designed to have an inductance (hereinafter referred to as L2) as high as 500 nH. SC1 thus slowly discharges electricity, and as a result, it is possible to reduce losses. As such, it is desirable that L2 is designed to be relatively high while L1 is designed to be relatively low. Specifically, it is desirable that L2 is twice as high as L1 or higher, or more desirably, ten times as high as L1 or higher. In the first embodiment, L2 is designed to be ten times as high as L1.

Second Improvement: Resonant Frequency of SL1V Caused by Switch-On of HS1 is 10 MHz or Lower Here, a problem of surge voltage across SL1 instead of HS1 will be discussed. The voltage across SL1 resonates with the surge voltage, which causes losses. The second improvement reduces these losses.

FIG. 4 indicates a graph formed by enlarging SL1V in FIG. 3 with respect to the time axis. A cycle period T1 in FIG. 4 is 3.00E-7 sec. It can be understood from this that the resonant frequency of SL1V (hereinafter simply referred to as "resonant frequency") is 3.3 MHz.

When HS1 is switched on (at a time point of "1.99E-5 sec" in FIG. 4), since the surge voltage is applied to SL1, the resonance of SL1V is caused. The snubber circuit 1 has such an operation mode.

In this specification, the "resonant frequency" of SL1V is, of frequency components included in SL1V, a frequency component (3.3 MHz) that indicates a largest voltage magnitude in the cycle period T1. In the example in FIG. 4, high frequency components such as a component of 50 MHz included in the cycle period T1 indicate relatively small voltage magnitudes. Hence, 50 MHz does not correspond to the definition of resonant frequency in this specification.

The frequency component of SL1V with the largest voltage magnitude greatly affects the losses in SL1. Thus, reducing the resonant frequency defined as described above leads to reducing the losses in SL1.

By limiting the resonant frequency to 10 MHz or lower, it possible to decrease losses (core loss and eddy current loss) at SL1. Since the resonant frequency is limited to 10 MHz or lower, it is possible to use a small coil formed of ferrite. The inductance of AR2 and the electrostatic capacity of SC1 determine the resonant frequency. By changing these two values as appropriate, is possible to limit the resonant frequency to 10 MHz or lower.

Second Embodiment

Figure 5:
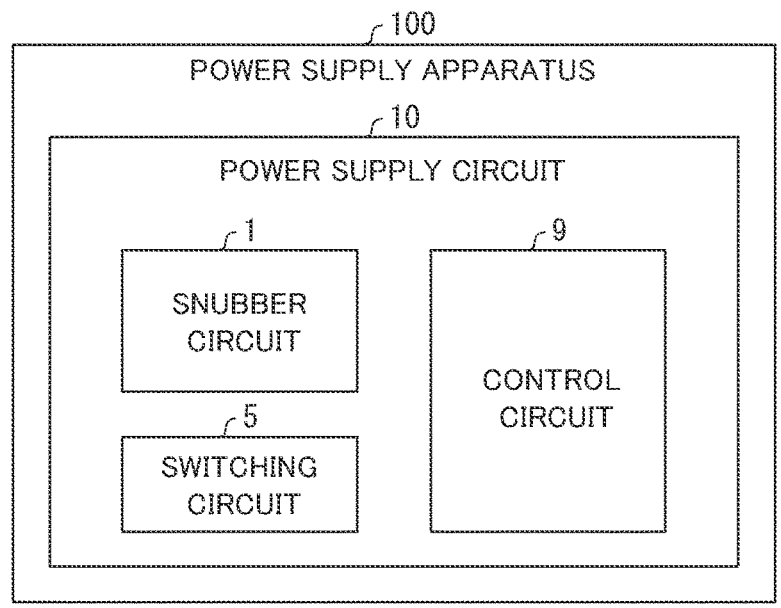
FIG. 5 illustrates a power supply apparatus according to a second embodiment.

FIG. 5 illustrates a power supply apparatus 100 including the power supply circuit 10. The power supply circuit 10 includes the snubber circuit 1, the switching circuit 5, and the control circuit 9. The control circuit 9 controls switch-on and -off of the components included in the power supply circuit 10. In particular, the control circuit 9 controls switch-on and -off of HS1 and LS1. Application examples of the power supply circuit 10 include an inverter circuit and a totem-pole power factor correction (PFC) circuit. In the power supply apparatus 100, the snubber circuit 1 decreases losses, and at the same time, surge voltage can be suppressed.

Conclusion

A snubber circuit according to a first aspect of the present disclosure is configured to be coupled to a switching circuit having a high potential node, a switch node, and a reference potential node. The snubber circuit includes a snubber capacitor, a diode, and a coil. The switching circuit includes an upper switch element coupled between the high potential node and the switch node, a lower switch element coupled between the switch node and the reference potential node, and a bypass capacitor coupled between the high potential node and the reference potential node. The positive electrode of the snubber capacitor is configured to be coupled to the high potential node. The diode is configured such that (i) the anode of the diode is coupled to the negative electrode of the snubber capacitor and (ii) the cathode of the diode is coupled to the switch node. The coil is configured such that (i) one end of the coil is coupled to the negative electrode of the snubber capacitor and (ii) the other end of the coil is coupled to the reference potential node.

With this configuration, the snubber capacitor is charged with the surge voltage caused across the upper switch element. The snubber capacitor is charged through a path constituted by the diode, the lower switch element, and the bypass capacitor. The charge voltage is smoothened by the coil and regenerated across the bypass capacitor (the bypass capacitor is charged with the voltage). As a result, it is possible to reduce losses in the snubber circuit.

In a snubber circuit according to a second aspect of the present disclosure, the inductance of a path constituted by the snubber capacitor, the coil, and the bypass capacitor may be higher than the inductance of a path constituted by the snubber capacitor, the diode, the lower switch element, and the bypass capacitor.

This configuration enables high speed charge of the snubber capacitor with surge voltage through a path having a relatively low inductance. In other words, the snubber capacitor can speedily absorb surge voltage. The voltage across the snubber capacitor charged with the absorbed surge voltage can be smoothened with a relatively high inductance and regenerated across the bypass capacitor.

In a snubber circuit according to a third aspect of the present disclosure, after the upper switch element is switched on, the resonant frequency of a voltage applied to the coil may be 10 MHz or lower.

Since this configuration limits the resonant frequency of the voltage caused across the coil to 10 MHz or lower, it is possible to decrease losses.

A power supply apparatus according to a fourth aspect of the present disclosure includes a snubber circuit according to an aspect of the present disclosure.

With this configuration, using the snubber circuit with decreased losses enables a power supply apparatus to operate with decreased losses.

A snubber circuit according to a fifth aspect of the present disclosure is configured to be coupled to a high potential node, a switch node, and a reference potential node. The snubber circuit includes a snubber capacitor, a diode, and a coil. The positive electrode of the snubber capacitor is configured to be coupled to the high potential node. The diode is configured such that (i) the anode of the diode is coupled to the negative electrode of the snubber capacitor and (ii) the cathode of the diode is coupled to the switch node. The coil is configured such that (i) one end of the coil is coupled to the negative electrode of the snubber capacitor and (ii) the other end of the coil is coupled to the reference potential node.

With this configuration, the snubber capacitor absorbs the surge voltage caused between the high potential node and the switch node (the snubber capacitor is charged). The charge voltage is smoothened by the coil and slowly discharged to the high potential node. As a result, it is possible to reduce losses in the snubber circuit.

Supplement

The present disclosure contains subject matter related to that disclosed in Japanese Priority Patent Application JP 2020-044290 filed in the Japan Patent Office on Mar. 13, 2020, the entire contents of which are hereby incorporated by reference.

An aspect of the present disclosure is not limited to the embodiments described above and various changes can be made within the scope described in the claims. Embodiments constituted by any combination of technical means disclosed in the different embodiments are embodied in the scope of an aspect of the present disclosure. Furthermore, by combining technical means disclosed in the embodiments with each other, a novel technical feature may be formed.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A snubber circuit configured to be coupled to a switching circuit having a high potential node, a switch node, and a reference potential node, the snubber circuit comprising:
    a snubber capacitor;
    a diode; and
    a coil, wherein
    the switching circuit includes
        an upper switch element coupled between the high potential node and the switch node,
        a lower switch element coupled between the switch node and the reference potential node, and
        a bypass capacitor coupled between the high potential node and the reference potential node,
    a positive electrode of the snubber capacitor is configured to be coupled to the high potential node,
    the diode is configured such that
        an anode of the diode is coupled to a negative electrode of the snubber capacitor, and
        a cathode of the diode is coupled to the switch node, and
    the coil is configured such that
        one end of the coil is coupled to the negative electrode of the snubber capacitor, and
        another end of the coil is coupled to the reference potential node.

2. The snubber circuit according to claim 1, wherein
    an inductance of a path constituted by the snubber capacitor, the coil, and the bypass capacitor is higher than an inductance of a path constituted by the snubber capacitor, the diode, the lower switch element, and the bypass capacitor.

3. The snubber circuit according to claim 1, wherein
    after the upper switch element is switched on, a resonant frequency of a voltage applied to the coil is 10 MHz or lower.

4. The snubber circuit according to claim 2, wherein
    after the upper switch element is switched on, a resonant frequency of a voltage applied to the coil is 10 MHz or lower.

5. A power supply apparatus comprising the snubber circuit according to claim 1.

6. A snubber circuit configured to be coupled to a high potential node, a switch node, and a reference potential node, the snubber circuit comprising:
    a snubber capacitor;
    a diode; and
    a coil, wherein
    a positive electrode of the snubber capacitor is configured to be coupled to the high potential node,
    the diode is configured such that
        an anode of the diode is coupled to a negative electrode of the snubber capacitor, and
        a cathode of the diode is coupled to the switch node, and
    the coil is configured such that
        one end of the coil is coupled to the negative electrode of the snubber capacitor, and
        another end of the coil is coupled to the reference potential node.

* * * * *